United States Patent [19]
Matsuzawa

[11] Patent Number: 6,047,394
[45] Date of Patent: Apr. 4, 2000

[54] CIRCUIT FOR EASILY TESTING A LOGIC CIRCUIT HAVING A NUMBER OF INPUT-OUTPUT PINS BY SCAN PATH

[75] Inventor: Hajime Matsuzawa, Tokyo, Japan

[73] Assignee: NEC Corporation, Tokyo, Japan

[21] Appl. No.: 08/982,042

[22] Filed: Dec. 1, 1997

[51] Int. Cl.[7] .................................................. H04B 17/00
[52] U.S. Cl. ........................ 714/729; 714/726; 714/724
[58] Field of Search ..................................... 714/729, 726, 714/724

[56] References Cited

U.S. PATENT DOCUMENTS 5,848,075  12/1998  Katayama et al. ..................... 714/724
5,903,579   5/1999  Osawa et al. .......................... 714/726

Primary Examiner—Phung M. Chung
Attorney, Agent, or Firm—Foley & Lardner

[57] ABSTRACT

A scan path circuit is for use in testing a logic package designed in accordance with scan path fashion. The logic package comprises a logic circuit and a plurality of scan paths. The logic circuit has first through N-th input/output pins, where N represents a positive integer which is greater than one. The scan paths are connected in serial to one another and are connected to the logic circuit. The scan path circuit comprises first through N-th memory sections which are connected in serial to one another and which are connected to the first through the N-th input/output pins, respectively. Each of the memory sections comprises a first memory circuit and a second memory circuit. The first memory circuit of an n-th memory section supplies test input to an n-th input/output pin in a shifting mode, where n is a variable between one and N. The first memory circuit of the n-th memory section takes test output from the logic circuit through the n-th input/output pin in a normal mode. The second memory circuit of the n-th memory section holds test input in the shifting mode to prevent the test input from varying to a varied input.

8 Claims, 5 Drawing Sheets

CIRCUIT FOR EASILY TESTING A LOGIC CIRCUIT HAVING A NUMBER OF INPUT-OUTPUT PINS BY SCAN PATH

BACKGROUND OF THE INVENTION

This invention relates to a circuit for use in testing a logic circuit such as an integrated circuit (IC) or a large scaled integrated circuit (LSI), more particularly, to a circuit for use in testing the logic circuit by scan path.

In general, it is known in the art that scan path is used on testing a logic circuit such as an integrated circuit (IC) or a large scaled integrated circuit (LSI). The scan path may be composed of flip-flops and latch circuits. More particularly, the logic circuit is located on a substrate together with scan paths which are connected in serial to one another. Such a logic circuit will be called a logic package. The logic circuit has a plurality of input/output (I/O) pins. The I/O pins of the logic circuit is connected to tester pins of a tester, respectively, on testing the logic circuit. Therefore, it is necessary to increase the number of the tester pins as the number of the I/O pins in the logic circuit becomes great. However, it is difficult to increase the number of tester pins as the number of the I/O pins increases. In other words, it is difficult to test a logic circuit having a number of I/O pins.

In order to easily test the logic circuit having a number of I/O pins, it is known In the art that a scan path circuit is used in testing the logic circuit.

It will be assumed that the logic package has a plurality of first scan paths and the scan path circuit has a plurality of second scan paths which is equal in structure to the first scan paths, respectively. The scan path circuit is located between the logic package and the tester. More particularly, the second scan paths of the scan path circuit are directly connected to the I/O pins of the logic circuit in a conventional scan path circuit, respectively. It is impossible to normally test the logic circuit as will be described later when the conventional scan path circuit is located between the logic package and the tester.

SUMMARY OF THE INVENTION

It is therefore an object of this invention to provide a scan path circuit capable of normally testing a logic circuit having a number of input/output pins.

Other objects of this invention will become clear as the description proceeds.

On describing the gist of this invention, it is possible to understand that a scan path circuit is for use in testing a logic package designed in accordance with scan path fashion. The logic package comprises a logic circuit and a plurality of scan paths. The logic circuit has a plurality of input/output pins. The scan paths are connected in serial to one another and are connected to the logic circuit.

According to an aspect of this invention, the scan path circuit comprises first means operable as a part of the scan paths for supplying test input data to the input/output pins in a shifting mode, the first means taking test output data from the logic circuit through the input/output pins in a normal mode and second means for holding the test input data in the shifting mode to prevent the test input data from varying to varied input data.

According to another aspect of this invention, the logic circuit has first through N-th input/output pins, where N represents a positive integer which is greater than one. The scan path circuit comprises first through N-th scan path section connected in serial to one another and connected to the first through the first through said N-th input/output pins, respectively. An n-th scan path section comprises first flip-flop means for supplying test input data to an n-th input/output pin in a shifting mode, the first flip-flop circuit taking test output data from the logic circuit through the n-th input/output pins in a normal mode and second flip-flop means connected to the first flip-flop means for holding the test input data in the shifting mode to prevent the test input data from varying to varied input data, where n is a variable between one and N, both of inclusive:

DESCRIPTION OF THE PREFERRED EMBODIMENTS

Figure 1:
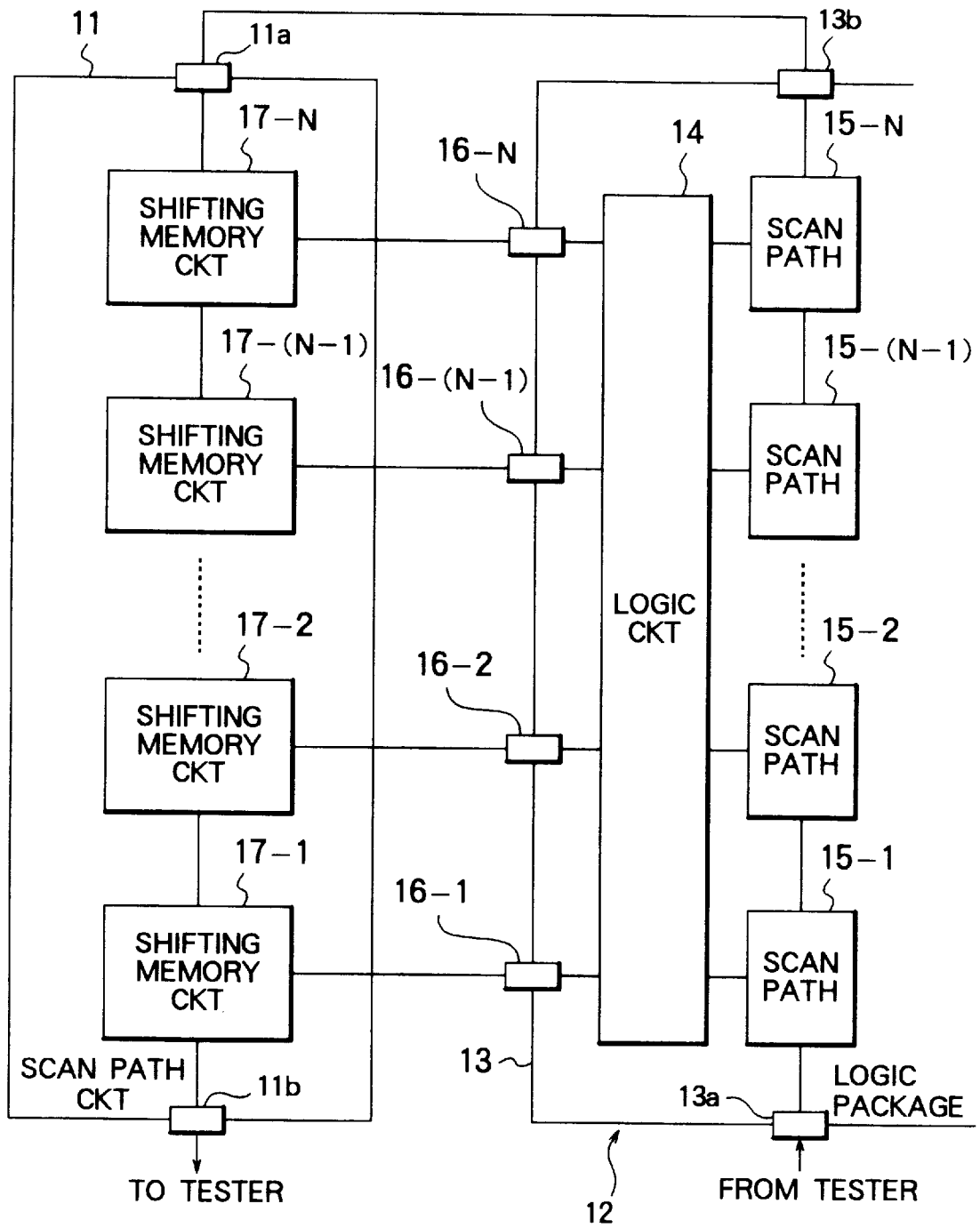
FIG. 1 is a block diagram for describing a conventional scan path circuit.

Referring to FIG. 1, a conventional scan path circuit will be described at first in order to facilitate an understanding of this invention. The illustrated scan path circuit 11 is located outside a logic package 12. The logic package 12 comprises a substrate 13 such an a printed substrate or a ceramic substrate. In the example being illustrated, a logic circuit 14 is mounted on the substrate 13. First through N-th scan paths 15-1 to 15-N are mounted or formed on the substrate 13, where N represents a positive integer greater than one. Each of the first through N-th scan paths 15-1 to 15-N has flip flop circuits and latch circuits although no illustration is made in FIG. 1. The first through N-th scan paths 15-1 to 15-N are connected in serial to one another and are connected to the logic circuit 14, respectively. The substrate 13 has a scan-in pin 13a and a scan-out pin 13b. The scan-in pin 13a is connected to the first scan path 15-1. The scan-out pin 13b is connected to the N-th scan path 15-N. The logic circuit 14 has first through N-th input/output (I/O) pins 16-1 to 16-N.

The scan path circuit 11 comprises first through N-th shifting memory circuits 17-1 to 17-N which are connected in serial to one another. An external scan paths are constructed by the first through the N-th shifting memory circuits 17-1 to 17-N. The scan path circuit 11 comprises scan-in and scan-out pins 11a and 11b. The N-th shifting memory circuit 17-N is connected to the scan-in pin 11a. The first shifting memory circuit 17-1 in connected to the scan-out pin 11b.

On testing the logic circuit 14, the scan path circuit 11 is connected to the logic package 12. More particularly, the scan-in pin 11a is connected to the scan-out pin 13b. The first through the N-th shifting memory circuits 17-1 to 17-N are connected to the first through the N-th I/O pins 16-1 to 16-N, respectively. Each of the scan-in pin 13a and the scan-out pin 11b is connected to a tester (not shown).

In a shifting mode, the tester supplies a test input data to the logic package 12 through the scan-in pin 13a. In the example being illustrated, the test input data is composed of first through N-th bits. The test data are shifted in the first through the N-th scan paths 15-1 to 15-N in order to set the first through the N-th bits in the first through the N-th scan paths 15-1 to 15-N, respectively. After setting the first through the N-th bits in the first through the N-th scan paths 15-1 to 15-N, respectively, the shifting mode transfers to a normal mode.

In the normal mode, the first through the N-th bits are supplied as first through N-th input bits from the first through the N-th scan paths 15-1 to 15-N to the logic circuit 14. In response to the first through the N-th input bits, the logic circuit 14 outputs first through N-th output bits which are supplied to scan path circuit 11. More particularly, the first through N-th output bits are supplied from the logic circuit 14 to the first through the N-th shifting memory circuits 17-1 to 17-N through the first through the N-th I/O ping 16-1 to 16-N, respectively. The first through the N-th shifting memory circuits store the first through the N-th output bits as first through N-th memorized bits therein, respectively.

The normal mode again transfers to the shifting mode. In the shifting mode, the first through N-th memorized bits are shifted in the N-th through the first shifting memory circuits 17-N to 17-1 In order to supply the first through the N-th memorized bits as a test output data to the tester through the scan-out pin 11b. The tester monitors the test output data in concern with the test input data.

By the way, each of the first through the N-th shifting memory circuits 17-1 to 17-N is operable as a scan path which will be called an external scan path. The first through the N-th external scan paths are directly connected to the first through the N-th I/O pins 16-1 to 16-N. In this connection, some ones of the first through the N-th output bits of the logic circuit 14 may inevitably vary on the first through the N-th I/O pins 16-1 to 16-N. As a result, it Is difficult to normally test the logic circuit 14 on using the scan path circuit 11 illustrated In FIG. 1.

Figure 2:
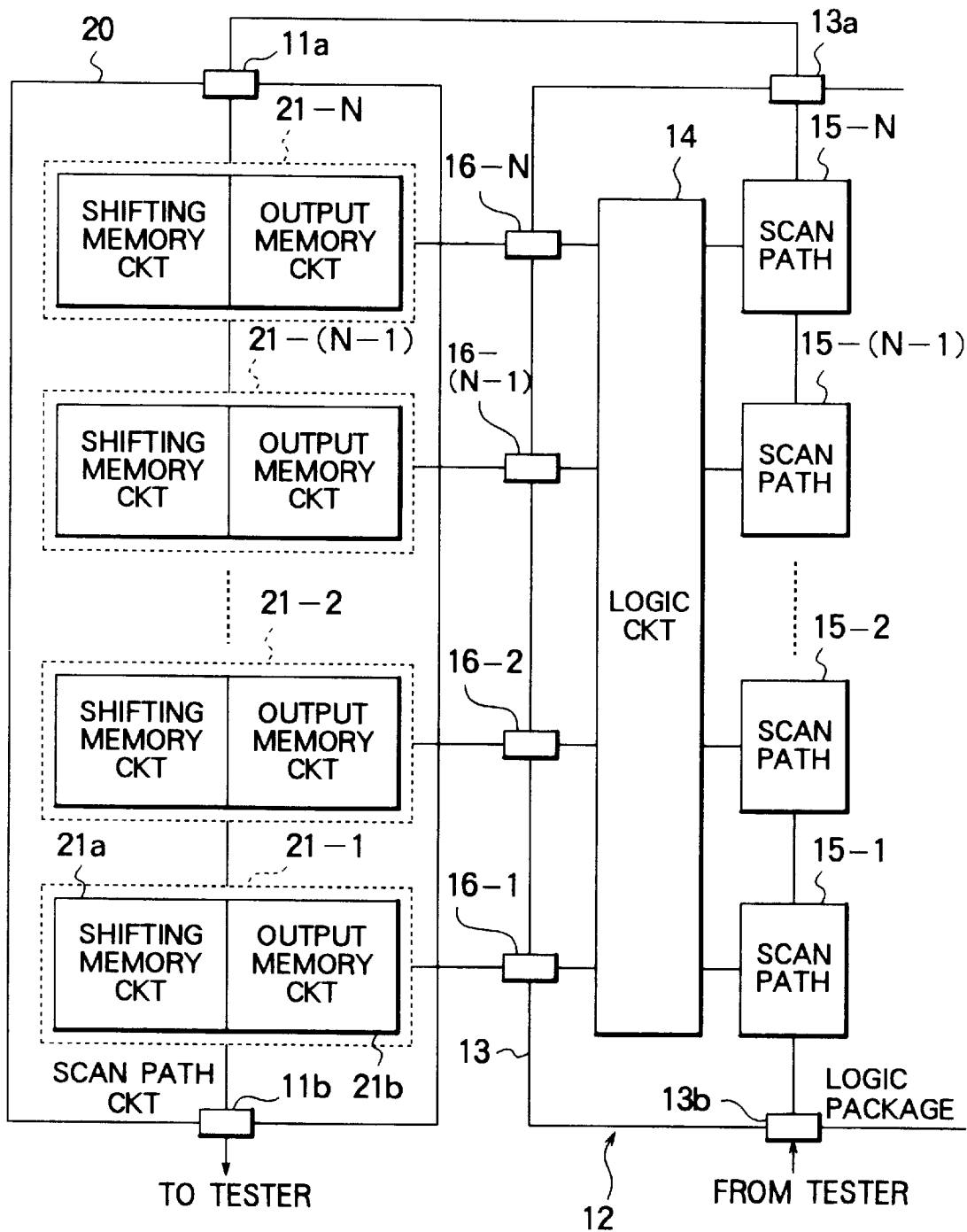
FIG. 2 is a block diagram for describing a scan path circuit according to a first embodiment of this invention.

Referring to FIG. 2, description will proceed to a scan path circuit according to an embodiment of this invention. The illustrated scan path circuit is different in structure from the scan path circuit 11 illustrated in FIG. 1 and is therefore designated afresh by a reference numeral 20. The scan path circuit 20 comprises similar parts which are designated by like reference numerals and operable with likewise named signals. In FIG. 2, the scan path circuit 20 is connected to the logic package 12 as described in conjunction with FIG. 1.

The scan path circuit 20 comprises first through N-th memory sections 21-1 to 21-N each of which has a shifting memory circuit 21a and an output memory circuit 21b. The first through the N-th memory sections 21-1 to 21-N are connected in serial to one another. Furthermore, the first and the N-th memory sections 21-1 to 21-N are connected to the first through the N-th I/O pins 16-1 to 16-N respectively. The first memory section 21-1 is connected to the scan-out pin 11b. The N-th memory section 21-N is connected to the scan-in pin 11a.

Figure 3:
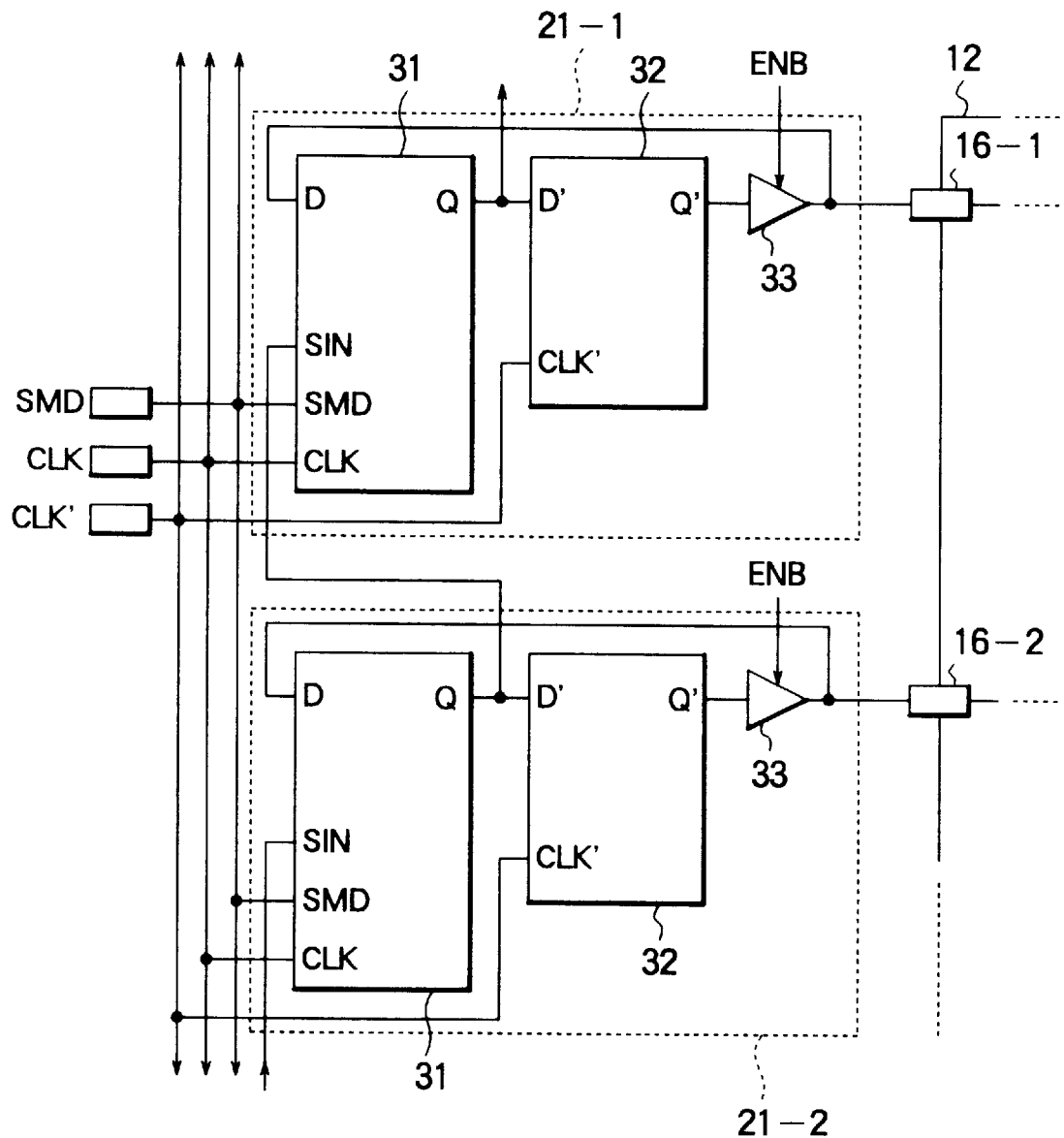
FIG. 3 is a circuit diagram of the scan path circuit illustrated In FIG. 2.

Referring to FIG. 3, description will be made as regards the first through N-th memory sections. The first through the N-th memory sections 21-1 to 21-N are similar in structure to one another. Attention will be directed to the first and the second memory sections 21-1 to 21-2. Each of the first and the second memory sections 21-1 and 21-2 comprises first and second flip-flop circuit 31 and 32 and a buffer 33. The first flip-flop circuit 31 is operable as the shifting memory circuit 21a. The second flip-flop circuit 32 and the buffer 33 are collectively operable as the output memory circuit 21b.

The first flip-flop circuit 31 has first primary and subsidiary input terminals which are labelled "D" and "SIN", respectively. The first flip-flop circuit 31 further has a first output terminal labelled "Q", a first clock terminal labelled "CLK", and a control terminal labelled "SMD". The second flip-flop circuit 32 has a second input terminal labelled "D'", a second output terminal labelled "Q'", and a second clock terminal labelled "CLK'".

The first primary input terminal "D" of the first flip-flop circuit 31 is connected to the output terminal of the buffer 33. The first output terminal "Q" of the first flip-flop circuit 31 is connected to the second input terminal "D'" of the second flip-flop circuit 32. The second output terminal "Q'" of the second flip-flop circuit 32 is connected to the input terminal of the buffer 33.

In the first memory section 21-1, the output terminal of the buffer 33 is connected to the first I/O pin 16-1. In the second memory section 21-2, the output terminal of the buffer 33 Is connected to the second I/O pin 16-2. Although no illustration is made in FIG. 3, the output terminal of the buffer 33 is connected to an n-th I/O pin 16-n in an n-th memory section 21-n, where n is a variable between one and N, both of inclusive.

The first flip-flop circuit 31 of the first memory section 21-1 is connected to the first flip-flop circuit 31 of the second memory section 21-2. More particularly, the first output terminal "Q" of the first flip-flop circuit 31 in the second memory section 21-2 is connected to the first subsidiary input terminal "SIM" of the first flip-flop circuit 31 in the first memory section 21-1. In general, the first output terminal "Q" of the first flip-flop circuit 31 in a (k+1)-th memory section 21-(k+1) is connected to the first subsidiary input terminal "SIM" of the first flip-flop circuit 31 in a k-th memory section 21-k, where k is a variable between 1 and (N−1), both of inclusive.

The first flip-flop circuit 31 operates in accordance with a first clock signal CLK which is supplied to the first clock terminal "CLK". Similarly, the second flip-flop circuit 32 operates in accordance with a second clock signal CLK' which is supplied to the second clock terminal "CLK'". In the shifting mode described in conjunction with FIG. 2, a control signal SMD is supplied to the control terminal SMD of the first flip-flop circuit 31. The first flip-flop circuit 31 becomes the shifting mode when the control signal SMD is supplied to the control terminal "SMD". In the shifting mode, the first flip-flop circuit 31 takes an input value supplied to the first subsidiary input terminal "SIN" as a caught value to output the caught value as a first subsidiary output value from the first output terminal "Q". The first subsidiary output value is supplied to the second input terminal "D'" to be taken as a supplied value in the second flip-flop circuit 32. The second flip-flop circuit 32 outputs the supplied value as a second output value from the second output terminal "Q'". The second output value is supplied to one of the first through the N-th I/O pins 16-1 to 16-N through the buffer 33. For example, the second output value is supplied to the first I/O pin 16-1 in the first memory section 21-1.

In the normal mode described in conjunction with FIG. 1, the control signal SMD is not supplied to the control terminal "SMD" of the first flip-flop circuit 31. The first flip-flop circuit 31 becomes the normal mode when the control signal SMD in not supplied to the control terminal "SMD". In the normal mode, the first flip-flop circuit 31 takes an input value supplied to the first primary input terminal "D" as the caught value to output the caught value as a first primary output value from the first output terminal "Q". The first primary output value is supplied to the second input terminal "D'" to be taken as the supplied value in the second flip-flop circuit 32.

By the way, the buffer 33 has an enable (ENB) terminal labelled "END". An enable signal is supplied to the enable terminal "END" of the buffer 33 in the first memory section 21-1 when the first I/O pin 16-1 in used as an input pin. The buffer 33 saves the supplied value outputted from the second flip-flop circuit 32 when the enable signal is supplied to the enable terminal "END", in order to supply the supplied value as the second output value to the first I/O terminal 16-1. Otherwise, the enable signal is not supplied to the enable terminal "END" of the buffer 33 in the first memory section 31-1 when the first I/O pin 16-1 in used as an output pin. The buffer 33 does not save the supplied value outputted from the second flip-flop circuit 32 when the enable signal is not supplied to the enable terminal "END". As a result, the supplied value is not supplied as the second output value to the first I/O pin 16-1.

In general, the n-th memory section 21-n supplies the second output value to the k-th I/O pin 16-n when the k-th I/O pin 16-k is used as the input pin. Otherwise, the n-th memory section 21-n does not supply the second output value to the k-th I/O pin 15-n when the k-th I/O pin 16-n is used as the output pin.

As readily understood from the above description, the first flip-flop circuit 31 becomes the shifting mode in each of the first through the N-th memory sections 21-1 to 21-N when the input data are supplied to the first through the N-th I/O pins 16-1 to 16-N. In this case, the buffer 33 is supplied with enable signal in each of the first through the N-th memory sections 21-1 to 21-N inasmuch as each of the first through the N-th I/O pins 16-1 to 16-N is used as the input pin.

On monitoring the output data of the logic circuit 14 illustrated in FIG. 2, the first flip-flop circuit 31 is put into the normal mode in each of the first through the N-th memory sections 21-1 to 21-N. In this case, the buffer 33 in not supplied with enable signal in each of the first through the N-th memory sections 21-1 to 21-N inasmuch an each of the first through the N-th I/O pins 16-1 to 16-N is used as the output pin. As a result, the output bit outputted from the first I/O pin 16-1 is taken into the first flip-flop circuit 31 of the first memory section 21-1. Similarly, the output bit outputted from the N-th I/O pin 16-N is taken into the first flip-flop circuit 31 of the N-th memory section 21-N. In general, the output bit outputted from the n-th I/O pin 16-n is taken into the first flip-flop circuit 31 of the n-th memory section 21-n. After that, the first flip-flop circuit 31 is again put into the shifting mode in each of the first through the N-th memory sections 21-1 to 21-N. The output data are outputted from the scan-out pin 11b in accordance with the shifting operation of scan path circuit 20 to be supplied to the tester.

As described above, the second flip-flop circuit 32 is supplied to the second clock signal CLK' different from the first clock signal CLK. Therefore, it is possible for the second flip-flop circuit 32 to hold the output value outputted from the first flip-flop circuit 31, on the shifting mode. It is possible to prevent supply of unexpected output to the logic circuit 14.

In case where the scan path circuit 20 illustrated in FIG. 2 is used on testing the logic circuit, it is sufficient that the tester is connected to a clock pin, a scan-in pin, a scan-out pin, a control pin, and so on. Therefore, it is possible to easily test the logic circuit even if the number of pins is small which are connected to the tester.

Figure 4A:
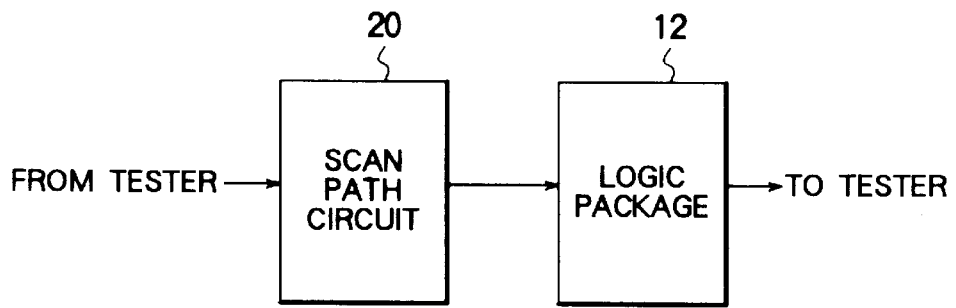
FIGS. 4A and 4B show a view for describing a connection of the scan path circuit illustrated in FIG. 2.

Referring to FIG. 4A, the test input data may be supplied from the tester to the scan path circuit 20 which is connected to the logic package 12. The scan paths of the logic package 12 is connected to the tester to supply the test output data to the tester.

Figure 4B:
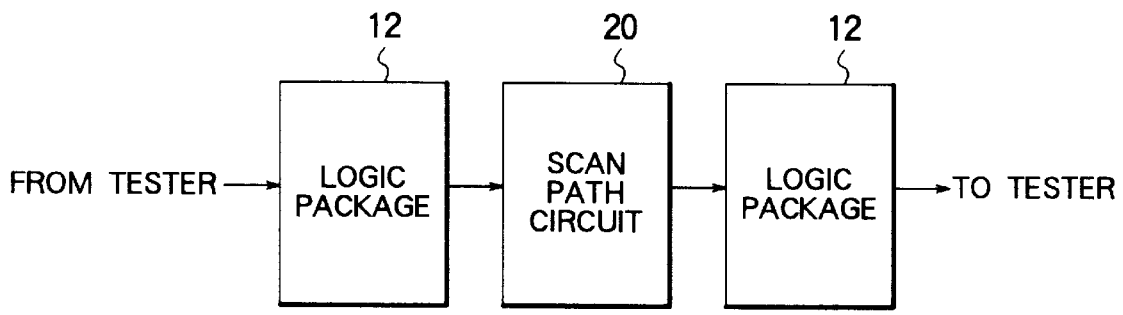

Referring to FIG. 4B, the test input data may be supplied from the tester to the scan paths of the logic package 12. The logic package 12 is connected to the scan path circuit 20. In this case, the scan path circuit 20 may be again connected to the logic package 12. The test output data of the scan paths are supplied from the logic package 12 to the tester.

Figure 5:
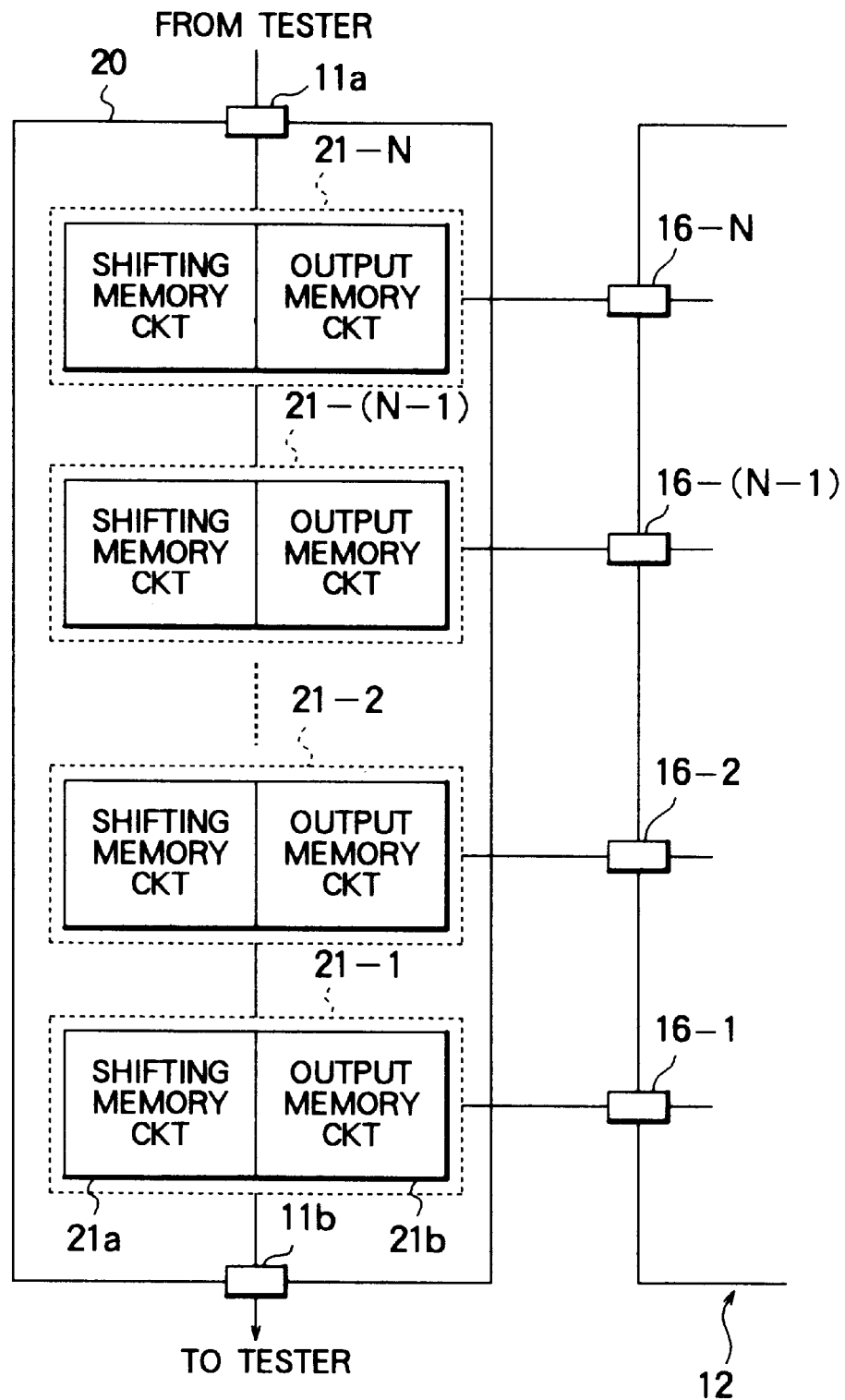
FIG. 5 is a block diagram for describing a scan path circuit according to a second embodiment of this invention.

The scan path circuit 20 may be connected to the logic package 12 an shown in FIG. 5. Referring to FIG. 5, the scan path circuit 11 is connected to only the first through the N-th I/O pins 16-1 to 16-N. The scan path circuit 20 is not connected to the scan paths (not shown) of the logic package 12. The scan-in pin 11a and the scan-out pin 11b are connected to the tester (not shown). Through the scan-in pin 11a, the tester supplies the test input data to the scan path circuit 20 illustrated in FIG. 5. Through the scan-out pin 11b, the tester monitors the test output data from the scan path circuit 11.

While this invention has thus far been described in conjunction with the preferred embodiment thereof, it will readily be possible for those skilled in the art to put this invention into practice in various other manners.

What is claimed is:

1. A scan path circuit for use in testing a logic package designed in accordance with scan path fashion, said logic package comprising a logic circuit and a plurality of scan paths, said logic circuit having a plurality of input/output pins, said scan paths being connected in serial to one another and being connected to said logic circuit, wherein said scan path circuit comprises:

first means operable as a part of said scan paths for supplying test input data to said input/output pins in a shifting mode, said first means taking test output data from said logic circuit through said input/output pins in a normal mode; and second means for holding said test input data in said shifting mode to prevent said test input data from varying to varied input data.

2. A scan path circuit as claimed in claim 1, wherein:

said scan path circuit has a first scan-in pin and a first scan-out pin each connected to said first means;

said logic package having a second scan-in pin and a second scan-out pin which are connected to said scan paths;

said first scan-in pin being connected to said second scan-out pin; and each of said first scan-out pin and said second scan-in pin being connected to a tester which supplies said test input data to said second scan-in pin and which monitors a test output data outputted from said first scan-out pin.

3. A scan path circuit as claimed in claim 1, said scan path circuit having a scan-in pin and a scan-out pin each of connected to said first means, said first means being connected to said input/output pins, wherein each of said scan-out pin and said scan-in pin being connected to a tester which supplies said test input data to said scan-in pin and which monitors a test output data outputted from said scan-out pin.

4. A scan path circuit for use in testing a logic package designed in accordance with scan path fashion, said logic package comprising a logic circuit and a plurality of scan paths, said logic circuit having first through N-th input/output pins, where N represents a positive integer which is greater than one, said scan paths being connected in serial to one another and being connected to said logic circuit, said scan path circuit comprising first through N-th scan path section connected in serial to one another and connected to said first through said first through said N-th input/output pins, respectively, wherein an n-th scan path section comprises, where n is a variable between one and N, both of inclusive:

first flip-flop means for supplying test input data to an n-th input/output pin in a shifting mode, said first flip-flop circuit taking test output data from said logic circuit through said n-th input/output pins in a normal mode; and second flip-flop means connected to said first flip-flop means for holding said test input data in said shifting mode to prevent said test input data from varying to varied input data.

5. A scan path circuit as claimed in claim 4, wherein:

said first and said second flip-flop means operates in accordance with first and second clock signals, respectively, and said first and second clock signals being different from each other.

6. A scan path circuit as claimed in claim 4, said first flip-flop means having a control terminal, wherein said first flip-flop means becomes said shifting mode when a control signal is supplied to said control terminal, otherwise said first flip-flop means becomes said normal mode.

7. A scan path circuit as claimed in claim 4, wherein said n-th scan path section further comprises path means for allowing said test input data to pass therethrough and thereby to supply said test input data to said n-th input/output pin when said n-th input/output pin is operable as an input pin, said path means preventing supply of said test input data to said n-th input/output pin when said n-th input/output pin is operable as an output pin.

8. A scan path circuit as claimed in claim 4, said first flip-flop means having first primary and first subsidiary input terminals and first output terminal, said second flip-flop means having a second input terminal and a second output terminal, wherein:

said n-th scan path section further comprises a buffer circuit located between said second flip-flop means and said n-th input/output;

said first primary input terminal being connected to said n-th input/output terminal in said n-th scan path section;

said first subsidiary input terminal of said n-th scan path section being connected to said first output terminal of a (n+1)-th scan path section;

said first output terminal being connected to said second input terminal in said n-th scan path section;

said second output terminal being connected to said buffer circuit; and said buffer circuit for allowing the output of said second flip-flop means as said test input data to pass therethrough when said n-th input/output pin is operable as an input pin, said buffer circuit preventing supply of said test input data to said n-th input/output pin when said n-th input/output pin in operable as an output pin.

\* \* \* \* \*

UNITED STATES PATENT AND TRADEMARK OFFICE
CERTIFICATE OF CORRECTION

PATENT NO. : 6,047,394
DATED : April 4, 2000
INVENTOR(S) : Hajime Matsuzawa

Page 1 of 1

It is certified that error appears in the above-identified patent and that said Letters Patent is hereby corrected as shown below:

Title page,
Please insert the following:
-- [30]  Foreign Application Priority Data

-- November 29, 1996  Japan..........................8-334689 --

Signed and Sealed this

Twenty-eighth Day of August, 2001

Attest:

*Nicholas P. Godici*

NICHOLAS P. GODICI
*Attesting Officer*  *Acting Director of the United States Patent and Trademark Office*